(12) United States Patent
Aziz et al.

(10) Patent No.: US 8,027,409 B2
(45) Date of Patent: Sep. 27, 2011

(54) NOISE PREDICTION-BASED SIGNAL DETECTION AND CROSS-TALK MITIGATION

(75) Inventors: Pervez M. Aziz, Dallas, TX (US); Mohammad S. Mobin, Orefield, PA (US); Gregory W. Sheets, Breinigsville, PA (US)

(73) Assignee: Agere Systems Inc., Allentown, PA (US)

( * ) Notice: Subject to any disclaimer, the term of this patent is extended or adjusted under 35 U.S.C. 154(b) by 884 days.

(21) Appl. No.: 11/962,409

(22) Filed: Dec. 21, 2007

(65) Prior Publication Data

US 2009/0161747 A1   Jun. 25, 2009

(51) Int. Cl.
*H03K 9/00*   (2006.01)
(52) U.S. Cl. ........ 375/316; 327/147; 327/156; 342/103; 342/442; 324/76.53; 375/215; 375/294; 375/327; 375/373; 375/376; 455/180.3
(58) Field of Classification Search .................. None
See application file for complete search history.

(56) References Cited

U.S. PATENT DOCUMENTS

| | | | | |
|---|---|---|---|---|
| 7,277,477 | B1 * | 10/2007 | Ahmad | 375/220 |
| 7,616,686 | B2 | 11/2009 | Aziz et al. | |
| 2002/0065664 | A1 * | 5/2002 | Witzgall et al. | 704/500 |
| 2006/0181319 | A1 * | 8/2006 | Zhang | 327/158 |
| 2007/0104264 | A1 * | 5/2007 | Park et al. | 375/233 |
| 2007/0195874 | A1 | 8/2007 | Aziz et al. | |

OTHER PUBLICATIONS

C.M. Zhao et al., "A Comparison of Different Noise Prediction Schemes for High Rate Digital Subscriber Loop Transmission," Singapore ICCS/ISITA, 1992, IEEE, pp. 1322-1326.
Stojanovic et al., "Autonomous Dual-Mode (PAM2/4) Serial Link Transceiver with Adaptative Equalization and Data Recovery," IEEE Journal of Solid-State Circuits, vol. 40, No. 4, pp. 1012-1026 (Apr. 2005).

* cited by examiner

*Primary Examiner* — Dac Ha
*Assistant Examiner* — Adolf Dsouza
(74) *Attorney, Agent, or Firm* — Mendelsohn, Drucker & Associates, P.C.; David L. Cargille; Steve Mendelsohn (57) ABSTRACT

In an exemplary embodiment, noise prediction-based data detection is described with respect to a SERDES (serializer/deserializer) backplane primary channel subject to inter-symbol interference (ISI) noise and added cross-talk noise from other channels. Noise prediction-based data detection combines an added error component from inter-symbol interference (ISI) noise and an added error component from cross-talk noise into an overall noise prediction error term and cancels effects of residual ISI and cross-talk for various components of the exemplary embodiment.

22 Claims, 8 Drawing Sheets

NOISE PREDICTION-BASED SIGNAL DETECTION AND CROSS-TALK MITIGATION

BACKGROUND OF THE INVENTION

1. Field of the Invention

The present invention relates to signal detection in a communication system, and, in particular, to signal detection using noise prediction.

2. Description of the Related Art

Figure 1:
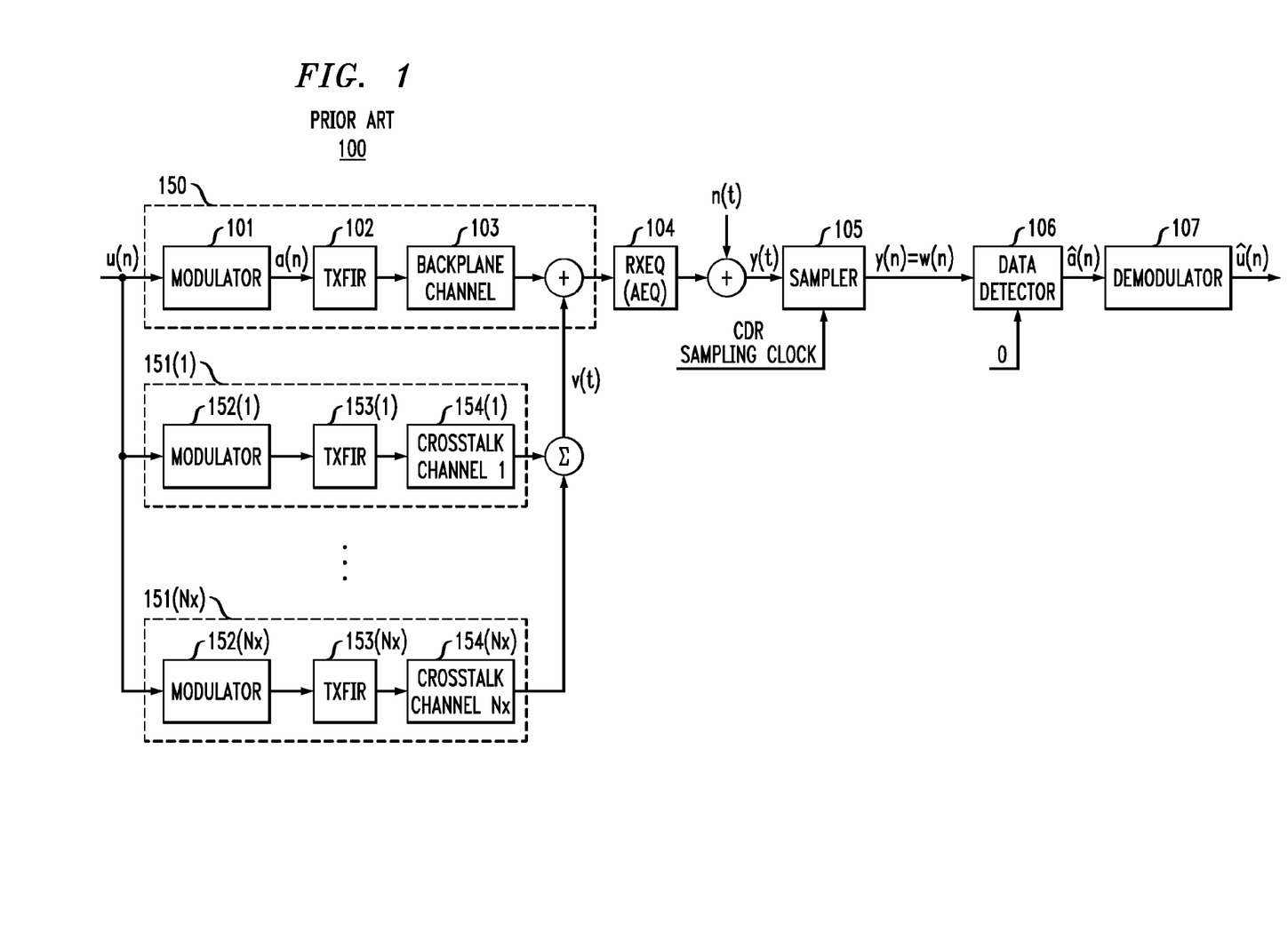
FIG. 1 shows a block diagram of a generic SERDES (serializer/deserializer) communication channel of the prior art.

Digital communication receivers sample an analog waveform and then detect the transmitted data from the sampled waveform. FIG. 1 shows a block diagram of a type of communication system 100 termed a generic SERDES (serializer/deserializer) communication channel, where impairments added in the channel are due to characteristics of a physical transmission medium for the channel, such as a backplane. In a primary channel 150, data u(n) at a transmitter is modulated by modulator 101. Modulator 101 employs modulation, such as non-return to zero (NRZ) or pulse amplitude modulation (PAM), to generate a modulated data signal a(n). The modulated data a(n) is then transmitted through backplane channel 103 after pre-equalization or pre-filtering through a transmit FIR filter (TXFIR) 102. After passing through backplane channel 103, the analog signal a(n) might be filtered by the receiver's equalizer (RXEQ) 104 which might include a continuous time filter (shown in FIG. 1 as an analog equalizer or "AEQ"). The analog signal y(t) provided by RXEQ 104 is sampled by sampler 105 at the baud rate based on a CDR sampling clock generated by a clock/data recovery (CDR) circuit (not shown in FIG. 1) to generated samples y(n).

The phase of the analog waveform applied to RXEQ 104 is typically unknown and might include a frequency/phase offset between the frequency at which the original data was transmitted and the nominal receiver's sampling clock frequency of the CDR circuit.

The CDR circuit desirably causes sampling of the analog waveform y(t) such that when the sampled waveform y(n) is passed through a data detector 106, the data is recovered properly despite that the phase/frequency of the analog waveform y(t) is not known. The CDR circuit is often implemented as an adaptive feedback circuit and the feedback loop adjusts the phase and frequency of the nominal clock to produce a modified clock, termed a recovered clock, employed by sampler 105.

After sampling y(t) to produce sampled output y(n)=y(nT), where T is the sampling and baud period, data detector 106 generates an estimate â(n) of the original modulated data a(n). Data detector 106 might be implemented as a simple slicer (a decision device based on an amplitude threshold) or a more complicated detector, such as a sequence or Viterbi detector. For high-speed applications, data detector 106 is often implemented as a slicer that is also clocked by the CDR sampling clock signal from the CDR circuit. The slicer quantizes the values of y(n) to a binary "1" or "0" based on the sampled analog value y(n) and a slicer threshold $s_t$. The slicer threshold $s_t$ might typically be 0, as indicated in FIG. 1. If the input to the slicer at sampling moment n is w(n) (which, for FIG. 1, might be equivalent to y(n)), then the output value â(n) of the slicer is given as follows in equation (1), where the logic "1" and "0" are represented as corresponding signed values "1" and "−1":

$$\hat{a}(n) = \begin{cases} 1, & \text{if } w(n) > s_t \\ -1, & \text{otherwise} \end{cases} \quad (1)$$

The estimates â(n) of the original modulated data a(n) are applied to demodulator 107 which demodulates the estimates â(n) to generate estimates û(n) of the original data u(n).

Several other impairment sources are also shown in FIG. 1. The left side of FIG. 1 shows a number of cross-talk paths 151(1) though 151(Nx) whose individual path outputs sum to create an overall cross-talk impairment signal v(t) added to the signal path of primary channel 150. Also shown in FIG. 1 is additive noise n(t) that might arise during processing within RXEQ 104 (e.g., n(t) is self-noise or output-referred noise of the AEQ). Although the figures herein each show the pre-filtering in the cross-talk paths with filters TXFIR 153(1) though TXFIR 153(Nx) similar to TXFIR 102 of primary channel 150, this is not necessarily the case in practice and does not affect the analysis herein.

As data rates increase for a particular SERDES channel application, the SERDES channel's performance degrades. Consequently, many SERDES channel applications use a decision feedback equalizer (DFE) at the receiver in conjunction with the pre-equalization through the transmit FIR filter (TXFIR).

Figure 2:
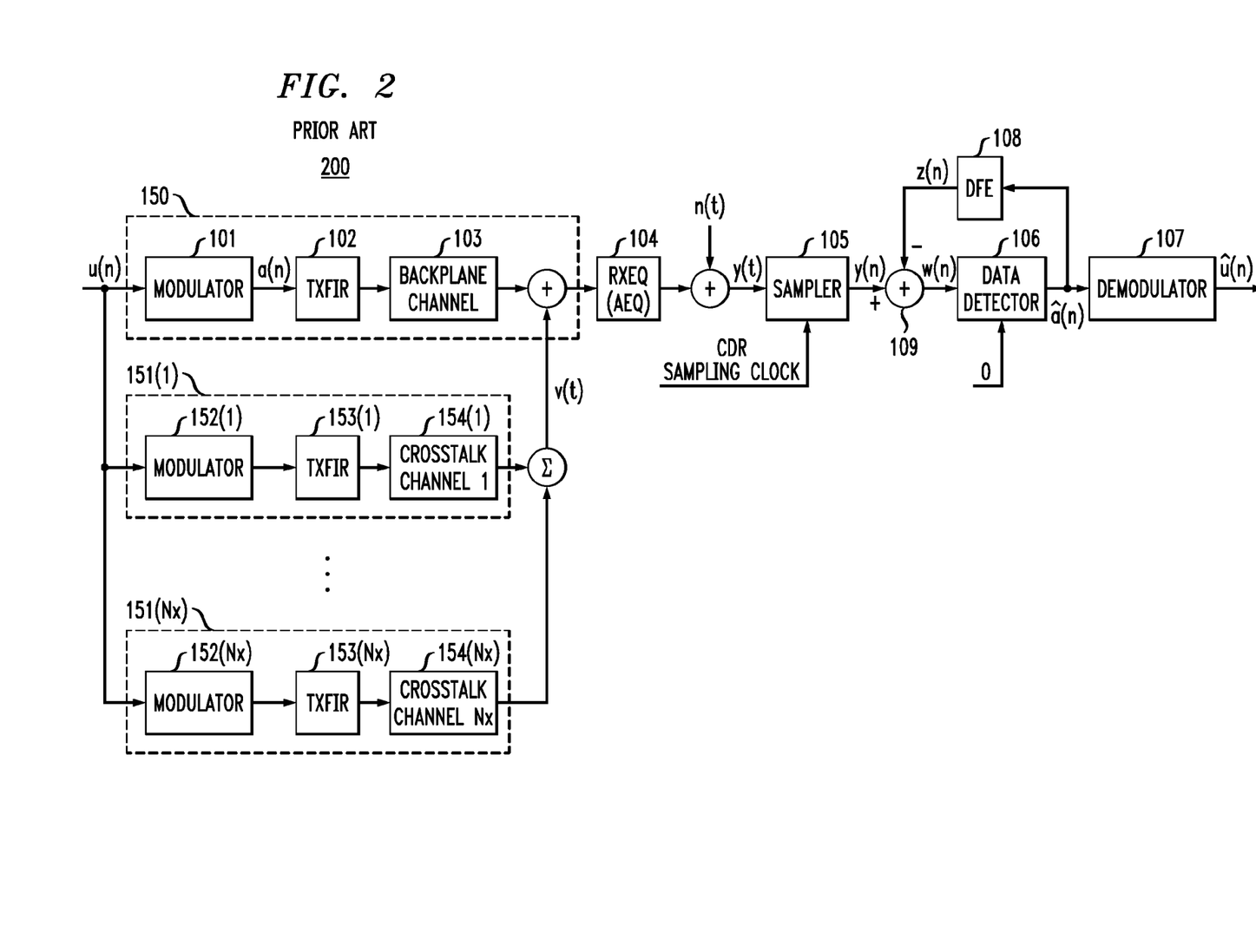
FIG. 2 shows a block diagram of the SERDES communication channel of the prior art shown in FIG. 1 incorporating a decision feedback equalizer.

FIG. 2 shows a block diagram of a SERDES system 200 such as discussed above with respect to FIG. 1 incorporating a traditional DFE 108. A correction, z(n), generated by DFE 108 is subtracted in combiner 109 from the signal, y(n), from sampler 105 to produce signal w(n) as given by equation (2):

$$w(n) = y(n) - z(n). \quad (2)$$

The output z(n) of DFE 108 is given by equation (3):

$$z(n) = \sum_{l=1}^{L} b(l)\hat{a}(n-l), \quad (3)$$

where b(l) represents the coefficients of the L-tap DFE.

From equation (3), DFE 108 receives as its input the past L-modulated data estimates (also referred to herein as "decisions") from data detector 106 ending at â(n−1). DFE filtering as given in equation (3) does not employ the current decision at â(n) so that the filtering operation of the DFE is causal. In operation, the entire DFE loop correction is desirably performed within one baud period T before the next correction is needed. In some cases, to avoid a speed bottle neck at very high data rates, a well-known technique is often employed whereby the DFE terms are pre-computed and selected based on the amplitude values of y(n). With this technique, since a DFE feedback loop is absent, the process of generating the DFE "corrected" decisions might be pipelined.

A DFE has the benefit of canceling post-cursor inter-symbol intereference (ISI) without enhancing input noise/cross-talk. However, the DFE does not directly cancel residual cross talk in the primary channel.

SUMMARY OF THE INVENTION

In one embodiment, the present invention allows for data detection in a serializer-deserializer (SERDES) system by: (a) quantizing a received signal to one of a plurality of levels; (b) generating a tentative error and a tentative decision for the quantized signal; (c) generating a set of noise-prediction filter tap coefficients for a filter from the tentative error; (d) applying the tentative error to the filter to generate an error estimate; (e) adjusting the quantized signal based on the error estimate; and (f) estimating a data value for the adjusted, quantized signal.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Exemplary embodiments of the present invention employ noise prediction-based data detection that combines added error from inter-symbol interference (ISI) noise and added error from cross-talk noise into an overall noise-prediction error term and reduces effects of ISI and cross-talk in a SERDES system. Data detection includes a decision feedback equalizer (DFE) at the receiver. In accordance with exemplary embodiments of the present invention, noise prediction-based data detection is described herein with respect to a SERDES backplane primary channel. Various embodiments of the present invention employ one or more of error terms generated in accordance with the present invention to update transmit filter coefficients, automatic gain control circuitry, receiver equalization filter coefficients, and clock/data recovery circuit sampling phase.

Figure 3:
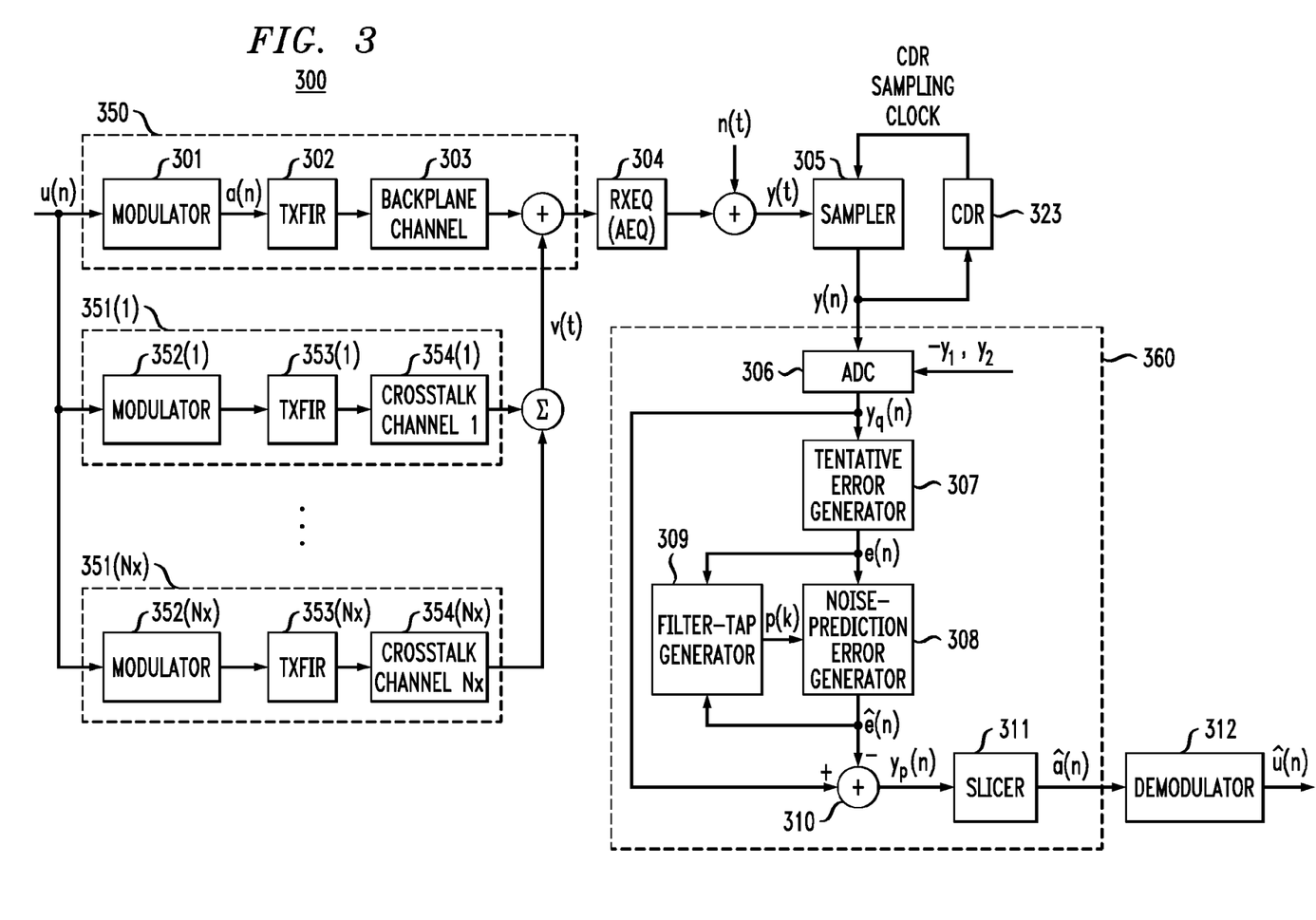
FIG. 3 shows a block diagram of noise prediction-based data detection in a SERDES communication channel in accordance with an exemplary embodiment of the present invention.

FIG. 3 shows a block diagram of noise prediction-based data detection in SERDES communication channel 300 in accordance with an exemplary embodiment of the present invention. For the SERDES communication channel 300, a transmit side passes data to a receive side through backplane channel 303. In primary channel 350, data u(n) at the transmit side of is modulated by modulator 301 according to a modulation technique, such as non-return to zero (NRZ) or pulse amplitude modulation (PAM). Modulator 301 generates a modulated data signal a(n), and pre-filtering (e.g., equalization or pulse shaping) by transmit FIR filter (TXFIR) 302 is applied to the modulated data signal a(n). The filtered, modulated data a(n) is then transmitted through backplane channel 303. Backplane channel 303 modifies the modulated data a(n) based on a transfer function, which includes inter-symbol interference (ISI) and dispersion effects.

As shown in FIG. 3, additive crosstalk noise v(t) is added from a number Nx of other channels 351(1) through 351(Nx). Each of the channels is similarly configured as the primary channel 350. For example, channel 351(1) includes a corresponding modulator 352(1), TXFIR 353(1), and crosstalk channel 354(1) having a corresponding crosstalk channel transfer function. Although the figure herein shows the pre-filtering in the crosstalk paths with filters TXFIR 353(1) through TXFIR 353(Nx) that are similar to TXFIR 302 of primary channel 350, this is not necessarily the case in practice and does not affect the analysis herein.

At the receiver side, the received signal from backplane channel 303 and additive noise v(t) is optionally filtered by receive equalizer (RXEQ) 304. RXEQ 304 might be implemented with a continuous time filter (e.g., an analog equalizer (AEQ)) to generate signal y(t). The analog signal y(t) provided by RXEQ 304 is sampled in sampler 305 at baud rate based on a sampling clock generated by clock/data recovery (CDR) circuit 323 to generated samples y(n). The phase of signal y(t) applied to RXEQ 304 is typically unknown and might include a frequency offset between the frequency at which the original data a(n) was transmitted and the nominal receiver's sampling clock frequency of the CDR circuit. The CDR circuit might be implemented as an adaptive feedback circuit having a feedback loop that adjusts the phase and frequency of the nominal clock to generate a recovered clock employed to sample y(t).

Noise-predictive detection in accordance with the exemplary embodiment of FIG. 3 is now described with respect to noise-prediction data detector 360. Noise-prediction data detector 360 comprises analog-to-digital converter (ADC) 306, tentative error generator (TEG) 307, noise-prediction error generator (NPEG) 308, filter-tap generator 309, combiner 310, and slicer 311. Noise-prediction data detector 360 provides estimates â(n) to demodulator 312 to generate demodulated user data.

The samples y(n) are applied to, and quantized by, ADC 306 to generate digital values $y_q(n)$ with B-bits of ADC resolution. In accordance with the exemplary embodiments herein, ADC 306 generates digital values $y_q(n)$ based on a range of amplitudes for the signal y(n), which digital values $y_q(n)$ might be centered around 0 for the described exemplary embodiment. The upper and lower values of this range of amplitudes for the signal y(n) are defined as $-y_1$ and $y_2$ (typically $y_1 = y_2$).

The level value $y_t$ is defined as the desired target level in the digital domain which might be achieved by adaptively setting the gain of an AEQ under the control of a digital AGC loop when RXEQ 304 is implemented with an AEQ. The ADC output signal $y_q(n)$ is sliced by a tentative decision slicer within TEG 307 to obtain a tentative decision $â_t(n)$ as given in equation (4):

$$â_t(n) = \begin{cases} 1, & \text{if } y_q(n) > 0 \\ -1, & \text{otherwise.} \end{cases} \quad (4)$$

The corresponding tentative error signal e(n) is as given in equation (5):

$$e(n) = y_q(n) - â_t(n)y_t, \quad (5)$$

Linear-predictive modeling for the estimate ê(n) generated by NPEG 308 for tentative error signal e(n) is as given in equation (6):

$$ê(n) = \sum_{k=1}^{N_p} e(n-k)p(k), \quad (6)$$

where the values p(k), $1 \leq k \leq N_p$, are noise-prediction filter coefficients and $N_p$ is the number of prediction filter taps for a noise prediction filter. Consequently, exemplary embodiments of the present invention employ filter-tap generator 309 to implement an algorithm to generate these noise-prediction filter coefficients, as described subsequently below.

Returning to FIG. 3, the noise-prediction-corrected equalized signal $y_p(n)$ is computed as given in the relations of equations (7) and (8):

$$y_p(n)=y_q(n)-\hat{a}(n), \text{ and} \quad (7)$$

$$y_p(n)=y_q(n)-\sum_{k=1}^{N_p}e(n-k)p(k). \quad (8)$$

The final detected and demodulated symbol decision is then obtained by digitally slicing the value of $y_p(n)$ by slicer 311 to provide estimates $\hat{a}(n)$ of the original modulated data $a(n)$ as given in equation (9):

$$\hat{a}(n) = \begin{cases} 1, & \text{if } y_p(n) > 0 \\ -1, & \text{otherwise.} \end{cases} \quad (9)$$

The sequence of estimates $\hat{a}(n)$ is applied to demodulator 312. Demodulator 312 demodulates estimates $\hat{a}(n)$ to generate estimates $\hat{u}(n)$ of the original data $u(n)$.

As described above, filter-tap generator 309 implements an algorithm to generate noise-prediction filter coefficients $p_k(n)$. Residual error $e_r(n)$ is defined as given in equation (10):

$$e_r(n)=e(n)-\hat{e}(n). \quad (10)$$

Residual error, $e_r(n)$, and tentative error $e(n-k)$ are applied to a least mean square (LMS) algorithm to update the noise-prediction filter coefficients ("filter taps") $p(k)$ at instant $(n+1)$ (i.e., $p_k(n+1)$) as given in equation (11):

$$p_k(n+1)=p_k(n)-2\mu e_r(n)e(n-k). \quad (11)$$

Figure 4:
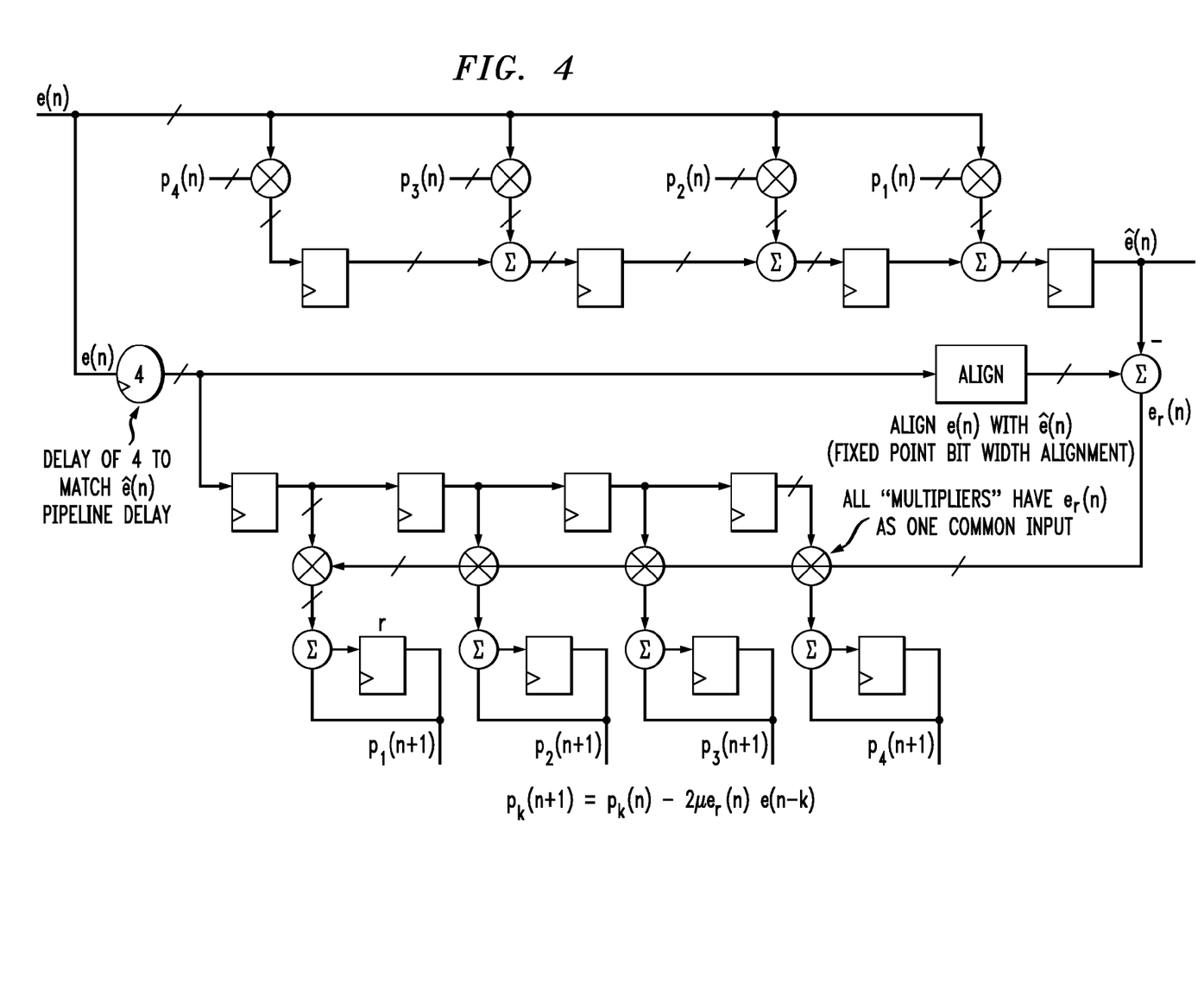
FIG. 4 shows a block diagram of a logic circuit that might be employed as an implementation of the noise-prediction error generator and the filter-tap generator of FIG. 3.

FIG. 4 shows a block diagram of a logic circuit that might be employed as an implementation of NPEG 308 and filter-tap generator 309 for a fixed-point implementation with four filter taps $p_1$, $p_2$, $p_3$, and $p_4$ that implements equations (6), (10), and (11).

The LMS algorithm provides for continuous adaptation of the filter taps $p(k)$, as described above. An alternative method to determine filter taps $p(k)$ might be to record the sequence of tentative error $e(n)$ values and compute the auto-correlation statistics of this sequence off-line. One off-line algorithm might employ these auto-correlation statistics to compute the filter taps $p(k)$ by solving for the corresponding Yule-Walker equations that are well-known in the art.

In operation, a system might employ a hybrid method to provide filter taps $p(k)$. The hybrid method might include a training period during which the $e(n)$ auto-correlation statistics might be gathered for off-line calculation of the prediction filter taps $p(k)$ and after which time the filter-tap coefficients are adaptively updated starting from their offline calculated values. The prediction correction might begin after the initial offline calculation or after final adaptive convergence of the tap values.

Figure 5:
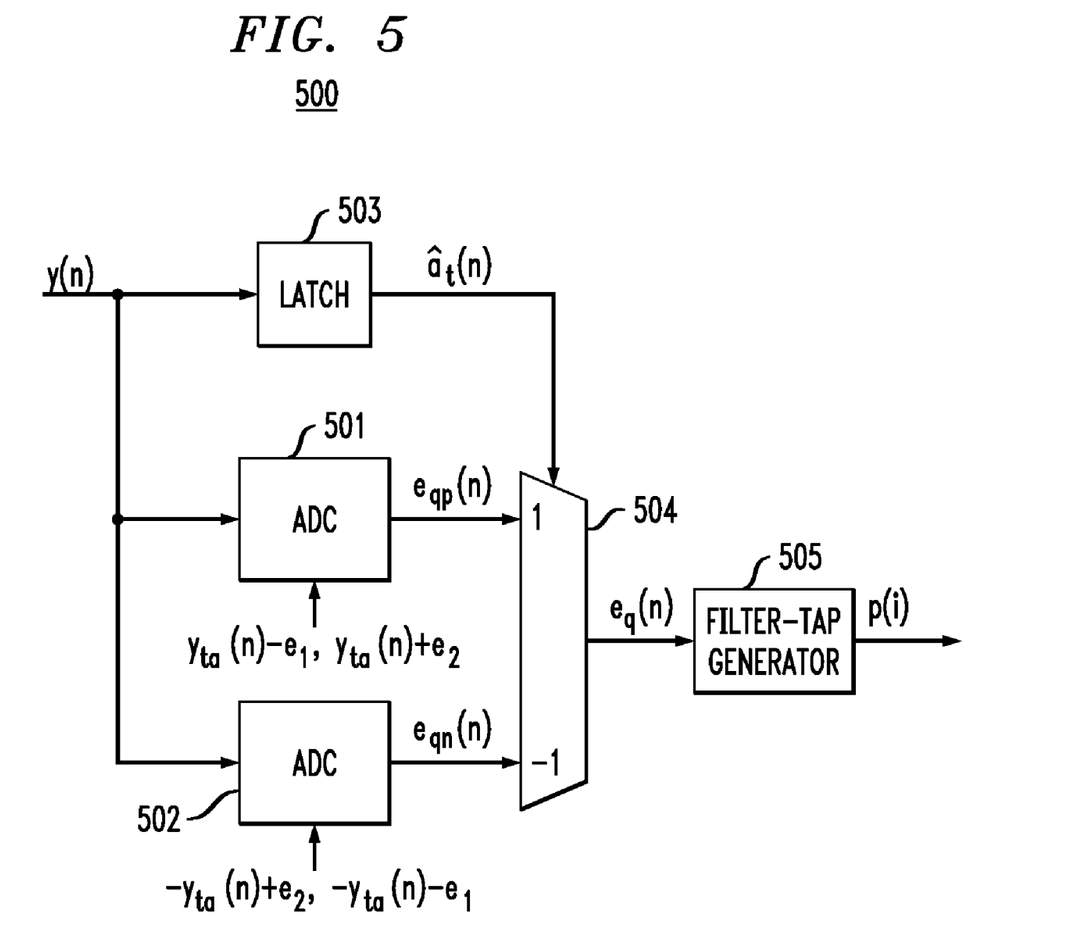
FIG. 5 shows an alternative embodiment of a noise-prediction data detector/demodulator of FIG. 3 when a training period is employed.

In the prior exemplary embodiment described with respect to FIG. 3, the error sequence $e(n)$ was obtained digitally as given from equation (5) based upon quantization of the values $y(n)$ using B-bit ADC resolution covering an amplitude range of $-y_1$ to $y_2$. An alternative embodiment of noise-prediction data detector/demodulator 360 of FIG. 3 might be employed when the SERDES system operates with a training period. FIG. 5 shows a noise-prediction data detector/demodulator 500 for when a training period is employed.

Since the error amplitude range might typically be smaller than the full signal range, during the training period a quantized version of the error sequence might be obtained. To obtain a quantized version of the error sequence, comparators of the ADC function applied to $y(n)$ are placed within the system so as to have reference levels relative to the two target decision levels, $y_t$, $-y_t$ whose corresponding analog voltage values are defined as $y_{ta}$ and $-y_{ta}$. Placement of comparators is shown in FIG. 5 as ADCs 501 and 502.

Consequently, a quantized error sequence is obtained and denoted herein as $e_q(n)$ to distinguish this sequence $e_q(n)$ from the digital error sequence $e(n)$ obtained as described above with respect to FIG. 3. During the training period, the tentative signal decisions $\hat{a}_t(n)$ might be obtained by slicing $y(n)$ as given in equation (12) with latch 503 of FIG. 5:

$$\hat{a}_t(n) = \begin{cases} 1, & \text{if } y(n) > 0 \\ -1, & \text{otherwise.} \end{cases} \quad (12)$$

Because the error ranges in amplitude from $y_{ta}-e_1$ to $y_{ta}+e_2$ and from $-y_{ta}-e_1$ to $-y_{ta}+e_2$, the magnitude of the values in this range might be smaller than the magnitudes in the range from $-y_1$ to $y_2$. Consequently, either (i) $e_q(n)$ might be computed with less quantization error than for $e(n)$ when directly derived from $y_q(n)$ for the same number B of ADC bits or (ii) fewer than the number B of ADC bits might be used to achieve the same quantization error performance as $e(n)$. In case (i), a more accurate computation of the values for $p(k)$ and, hence, relatively better final detection performance might result. In case (ii), a savings in area and power required for a given implementation of a system incorporating an embodiment of the present invention might result.

Referring to FIG. 5, the values $e_{qp}(n)$ and $e_{qn}(n)$ are the quantized errors associated with the positive and negative tentative decisions, respectively, and $e_q(n)$ is the final selected quantized error which is used to obtain the prediction coefficients $p_k$. The final selected quantized error $e_q(n)$ is selected in MUX 504 based on the value of $\hat{a}_t(n)$ and provided to filter-tap generator 505.

While ADCs 501 and 502 are shown in FIG. 5, one skilled in the art might employ time sharing of a single ADC and/or operating each ADC employed at a down-sampled rate. During certain bit times, a single ADC implementation might employ reference levels configured for errors associated with $\hat{a}_t(n)=$"1" values while, during other bit times, the ADC reference levels might be configured for errors associated with $\hat{a}_t(n)=$"−1" values. Operation with down-sampling implies that each ADC might not operate on data at every bit time but at intermittent bit times (e.g., every 4th or 8th bit time). Time sharing each ADC and/or operating each ADC at a down-sampled rate might be advantageous during training mode when error samples might not be generated every symbol or bit period.

Figure 6:
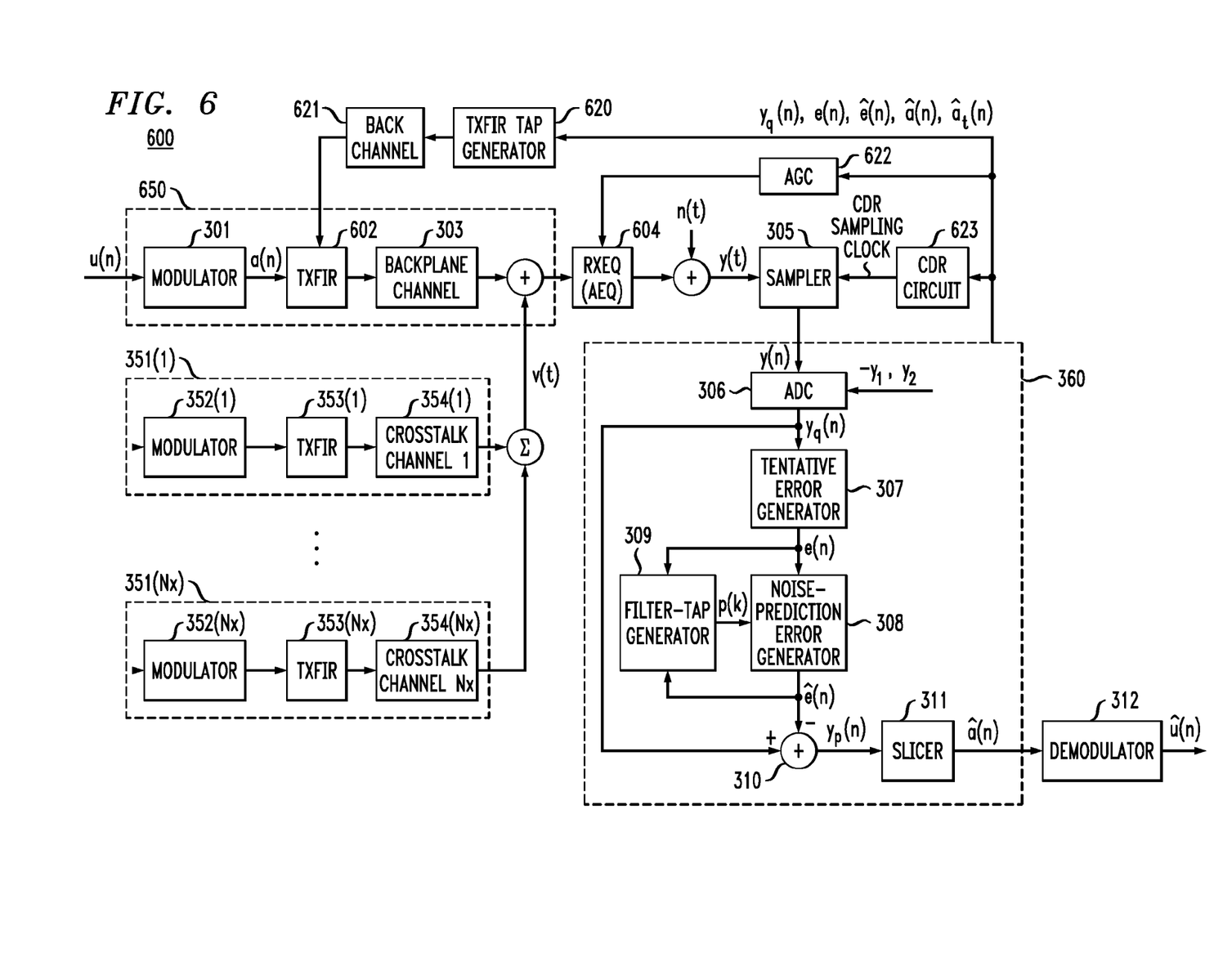
FIG. 6 shows a block diagram of an exemplary embodiment of the present invention combining adaptive equalization with noise prediction.

FIG. 6 shows an exemplary embodiment of the present invention for a SERDES system 600 combining adaptive equalization with noise prediction. Adaptative equalization employs one or more signals from the set of sequences ($y_q(n)$, $e(n)$, $\hat{e}(n)$, $\hat{a}(n)$, $\hat{a}_t(n)$). For example, at the transmit side in primary channel 650, the filter taps of TXFIR 602 might be adaptively updated with tap coefficients generated by TXFIR tap generator 620 using a version of the LMS algorithm as given in equation (13):

$$c_k(n+1)=c_k(n)-2\mu_c y_q(n)e(n-k), \quad (13)$$

or the tap coefficients of TXFIR 602 might be adaptively updated with tap values generated by TXFIR tap generator 620 using a sign-sign version of the LMS algorithm such as given in equation (14):

$$c_k(n+1) = c_k(n) - 2\mu_c sgn(y_q(n))sgn(e(n-k)), \quad (14)$$

where the sgn function generates a "1" decision if the input value to the function is greater than zero and generates a "−1" decision if the input value is less than or equal to zero. Preferred embodiments might employ the error values ê(n) instead of values e(n) in equations (13) and (14).

The adapted/updated tap coefficients are sent back to the transmit side via back channel 621, which might be present in certain SERDES applications. Back channel 621 might be used in certain applications (e.g., IEEE 802.3AP) during a training mode to optimize/update the transmitter's various operating coefficients. In principle, back channel 621 operates in a similar manner to the forward primary channel 650 with some possible exceptions. One exception is that the data transmission rate of back channel 621 might be much lower than the rate in forward primary channel 650 because, by being in training mode, system 600 does not necessarily require transmission of data through the back channel in real time. Consequently, the channel ISI effects are significantly less, leading to enhanced error rate performance of back channel 621. Thus, any information generated during training and transmitted via back channel 621 is expected to reach the other side with high probability without error. In addition, error detection/correction coding (e.g., repetition coding) can be used to further enhance error rate performance. Since back channel 621 operates at a relatively lower data rate than the forward primary channel 650, the tap coefficients for TXFIR 602 might be reliably transmitted without sophisticated equalization and detection in back channel 621.

The gain gn of equalizer 604 (shown as an AEQ in FIG. 6) at the receive side might also be adaptively updated by automatic gain control (AGC) circuit 622 based on one or more signals from the set $(y_q(n), e(n), e(n), \hat{e}(n), \hat{a}_t(n))$ using an LMS algorithm such as given in equation (15):

$$gn(n+1) = gn(n) - 2\mu_c y_q(n) e(n), \quad (15)$$

or might be adaptively updated using a sign-sign version of the LMS algorithm such as given in equation (16):

$$gn(n+1) = gn(n) - 2\mu_c sgn(y_q(n))sgn(e(n)). \quad (16)$$

The CDR sampling phase at the receive side may also be adaptively updated by CDR circuit 623 using one or more of the signals from the set $(y_q(n), e(n), \hat{e}(n), \hat{a}(n), \hat{a}_t(n))$, for example, based on a minimum mean squared error (MMSE)-type phase-detection CDR.

Non-return-to-zero (NRZ) equalization is employed for the above-described embodiments. For NRZ equalization, one of two level amplitude signals "1" or "−1" are transmitted and, at the receive side, detected as one of "1" and "−1". However, the present invention might be extended to other embodiments employing other equalization methods, such as partial response (PR) or multi-level pulse amplitude modulation (PAM). For example, PAM4 is a pulse amplitude method that employs 4-level amplitude modulation.

For a PAM4 implementation, the techniques described for the previous embodiments might be modified (i) for calculation of the tentative decision $\hat{a}_t(n)$ and (ii) for the digital slicer calculation for the final detected data $\hat{a}(n)$. For the example of a PAM4 implementation, let "3" "1", "−1", "−3" be the nominal PAM4 amplitudes transmitted and expected by the receiver. The digital slicing calculation that generates the decisions for the received signals resolves the received data $y_q(n)$, or corrected data $y_p(n)$, to one of these four levels instead of the two levels for the NRZ case. For the multi-ADC approach during training, as many ADCs are needed as there are decision levels. However, as previously described, the ADCs might be operated using down-sampling and/or time-sharing among the various decision levels.

Figure 7:
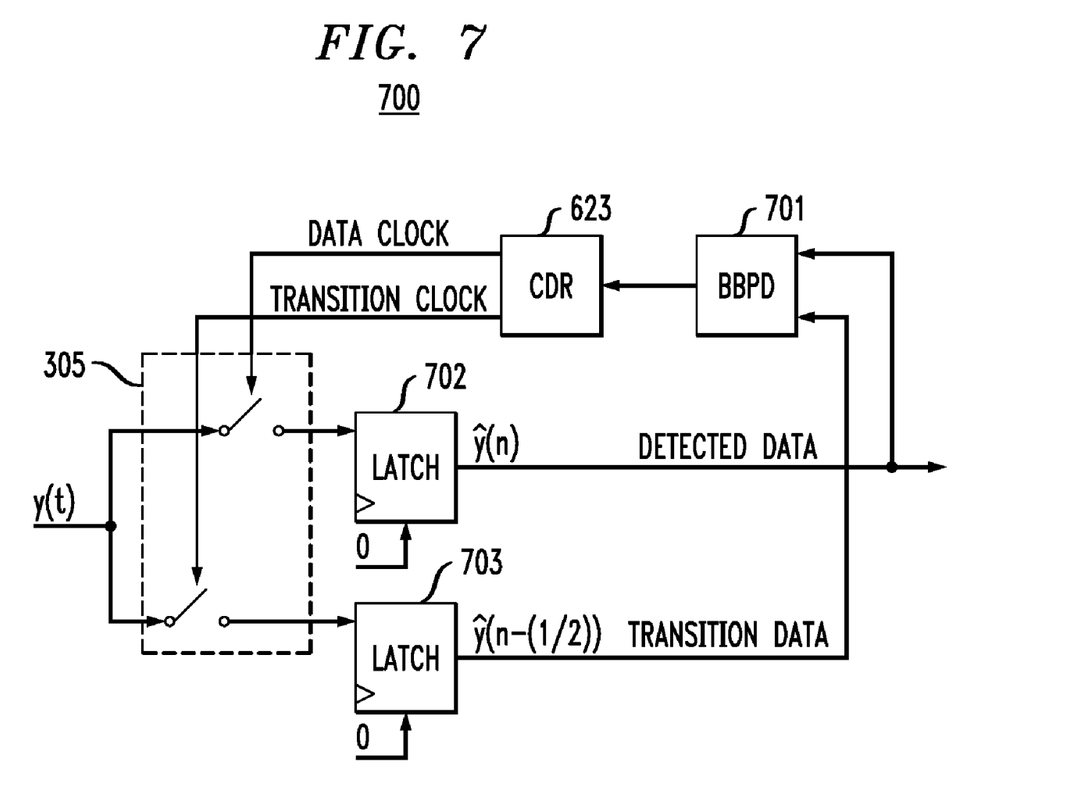
FIG. 7 shows a block diagram of a data detector having a bang-bang phase detector as might be employed with the CDR of FIG. 6.

A CDR loop such as shown in FIG. 6 performs baud sampling using input signals that are strictly baud sampled (e.g., by using an MMSE or Mueller-Muller phase detector based CDR) or might employ oversampled phase detectors (e.g., such those employing a "bang-bang" phase detector-based CDR loop). FIG. 7 shows a block diagram of data detector 700 as might be employed with CDR 623 of FIG. 6. Data detector 700 employs "bang-bang" phase detector (BBPD) 701, and, for simplicity, interference and other additive noise due to cross talk paths is not shown in the figure. Two clock signals are generated within data detector 700: a data clock signal and a transition clock signal, which transition clock signal phase is offset by 0.5 T sample phase from the data clock signal. The data clock signal and transition clock signal are used to sample input signal y(t) (by sampler 305) and clock latches 702 and 703, which produce main detected data decisions and "transition data" decisions. When implemented, BBPD 701 as shown in FIG. 7 might be a separate circuit from, or incorporated within circuitry of, CDR 623.

When a dual ADC implementation is employed for generating detected data, the data detector allocates two ADCs as one ADC for the data path and one ADC for the transition path (note that ADCs might be "re-used" after being employed by the training portion of the operation described above). An ADC produces the quantized amplitude, $y_q(n)$, for the data path that is converted to a tentative detected data decision $\hat{a}_t(n)$. Another ADC produces the quantized amplitude, $y_q(n-1/2)$, for the transition path that is converted to a tentative transition data decision $\hat{a}_t(n-1/2)$. BBPD 701 employs the tentative decisions $\hat{a}_t(n)$ and $\hat{a}_t(n-1/2)$ to generate the correct sampling phase for CDR 623. Hardware requirements might be simplified in some embodiments by not computing errors for the transition path and use only a slicer or latch to generate decisions in this path.

Noise prediction in the described embodiments for a SERDES channel previously applied correction in the digital signal domain to $y_q(n)$ to produce $y_p(n)$ that is then digitally sliced to provide a final decision $\hat{a}(n)$. Data detection might be enhanced by slicing in combination with sequence or Viterbi detection. Consequently, for such alternative embodiments, the noise prediction correction might be performed in a signal-dependent fashion in the branch metric calculations of the sequence or Viterbi detector.

For the described embodiments above, the initial signal (e.g., the input signal to the receiver) is applied to the ADC and is equalized to a NRZ partial response. An alternative embodiment including hybrid DFE and noise prediction is now described in which the initial signal is first equalized to a partial DFE response, and then the equalization and data detection operations are enhanced with noise prediction techniques described previously. Since a higher number of DFE taps are difficult to implement in the analog domain due to requirements on closed loop feedback settling time as well as increased analog complexity, preferred embodiments might employ a one-tap DFE prior to generating tentative decisions at the ADC. A one-tap DFE in combination with NRZ equalization is advantageous for a given implementation and might enhance performance significantly over NRZ equalization without use of DFE. Latency of the decisions at the DFE output might be significantly less than at the output of the fully noise predictive equalized system. Therefore, if a system such as shown in FIG. 6 applies additional equalization during sampling after the RXEQ (e.g., RXEQ 604) but before generating tentative decisions at the ADC (e.g., ADC 306) with a one-tap DFE, CDR 623 might employ tentative DFE-based decisions that are more reliable (e.g., a higher probability of being correct). Also, some implementations of the TXFIR and AEQ might exhibit simpler hardware requirements since the TXFIR and AEQ might provide less equalization capability (high frequency boost) with the presence of the one-tap DFE.

Figure 8:
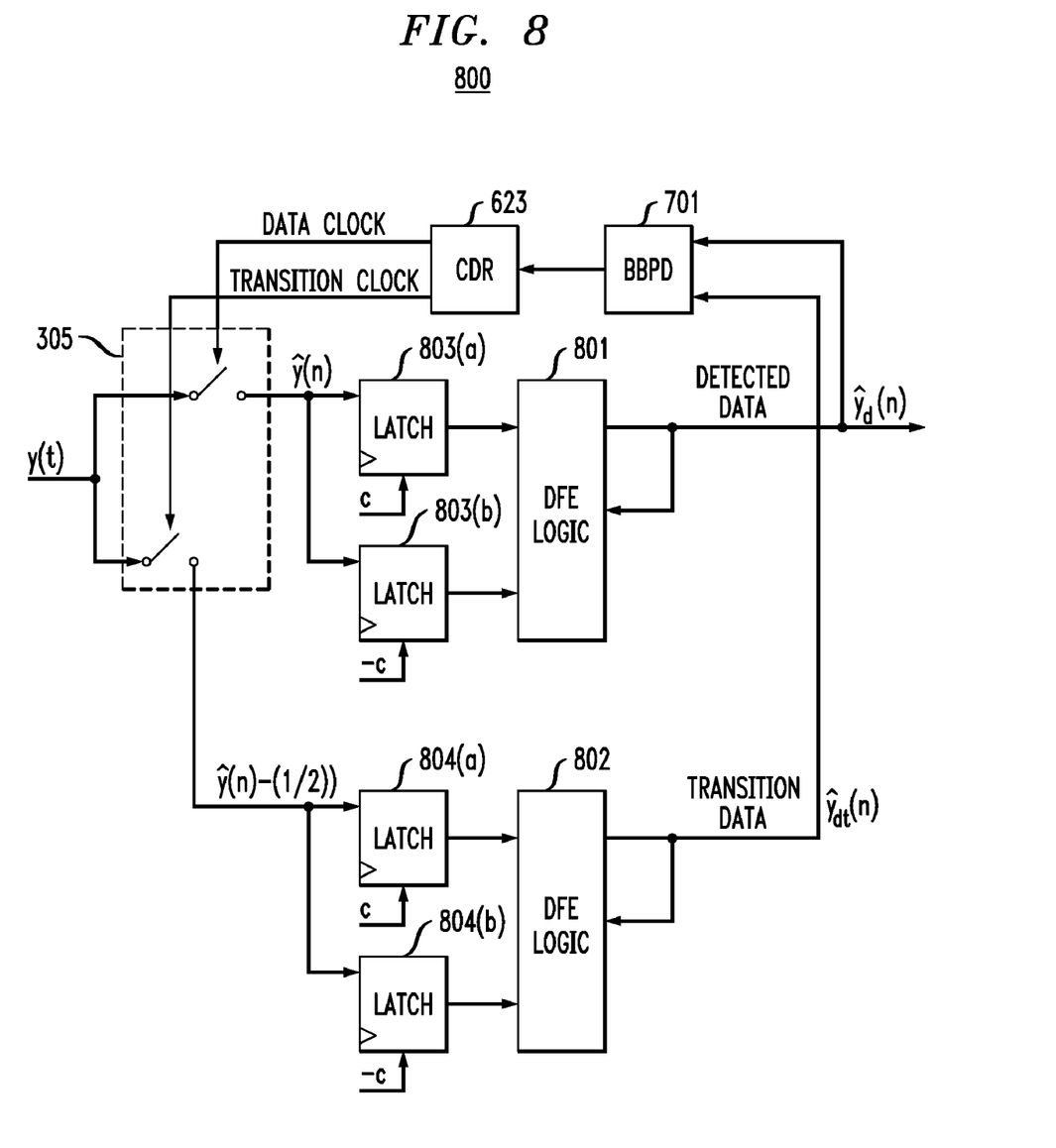
FIG. 8 shows an alternative embodiment of data detector of FIG. 7 employing a one-tap DFE.

A one-tap DFE data detector implemented using a threshold based approach as employed by an exemplary embodiment of the present invention is shown in FIG. 8. Such a one-tap DFE is described in U.S. patent application Ser. No. 11/356,691 to Aziz et al., "Method and Apparatus for Generating One or More Clock Signals for a Decision Feedback Equalizer Using DFE Detected Data," filed Feb. 17, 2006, which is incorporated herein by reference in its entirety. One-tap DFE data detector 800 is similar to data detector 700 of FIG. 7, but employs one-tap DFE logic filters 801 and 802 for the transition data and detected data paths, respectively. Each of one-tap DFE logic filters 801 and 802 has corresponding input latches. For the transition data path, DFE logic filter 801 employs an advantageous sample phase based on the output of corresponding transition latches 803(*a*) and 803(*b*) using thresholds c and –c, respectively, which produce DFE detected data (i.e., tentative DFE filtered detected data decisions). For the detected data path, DFE logic filter 802 operates analogously to DFE logic filter 801 using corresponding transition latches 804(*a*) and 804(*b*) with thresholds c and –c, respectively, which produce DFE transition data (i.e., tentative DFE filtered transition data decisions). DFE transition data along with DFE detected data drives BBPD 701. In FIG. 8, BBPD 701 is shown external to CDR 623, but one skilled in the art might combine the BBPD with the circuitry of the CDR.

Tentative signal/error generation of data detector/demodulator 360 (FIG. 6) receives the DFE tap value of one-tap DFE logic filters 801 and 802, which is equivalently the latch threshold c. Since c is a programmed quantity, it might have an equivalent digital value that is then converted to an analog value for use with latches 803(*a*), 803(*b*), 804(*a*), and 804(*b*). However, instead of using $y_{qc}(n)$ for noise prediction and detection processing by data detector/demodulator 360, the following value $y_{qc}(n)$ as given in equation (17) having a digital DFE correction term corresponding to the one-tap DFE operation is used for updating the CDR 623 and tentative error generator 307:

$$y_{qc}(n) = y_q(n) - c\hat{a}_t(n-1) \quad (17)$$

where $$\hat{a}_t(n) = \begin{cases} 1, & \text{if } y_{qc}(n) > 0 \\ -1, & \text{otherwise.} \end{cases}$$

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The present invention may be implemented as circuit-based processes, including possible implementation as a single integrated circuit (such as an ASIC or an FPGA), a multi-chip module, a single card, or a multi-card circuit pack. As would be apparent to one skilled in the art, various functions of circuit elements may also be implemented as processing blocks in a software program. Such software may be employed in, for example, a digital signal processor, microcontroller, or general-purpose computer.

The present invention can be embodied in the form of methods and apparatuses for practicing those methods. The present invention can also be embodied in the form of program code embodied in tangible media, such as magnetic recording media, optical recording media, solid state memory, floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits. The present invention can also be embodied in the form of a bitstream or other sequence of signal values electrically or optically transmitted through a medium, stored magnetic-field variations in a magnetic recording medium, etc., generated using a method and/or an apparatus of the present invention.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Signals and corresponding nodes or ports may be referred to by the same name and are interchangeable for purposes here.

We claim:
1. A method of data detection in a serializer-deserializer (SERDES) system comprising the steps of:

(a) quantizing a received signal to one of a plurality of levels based on an error bound for each level;
(b) generating a tentative error and a tentative decision for the quantized signal by:
  (b1) generating a set of tentative errors for the plurality of levels based on the quantized signal for each one of the plurality of levels, and
  (b2) selecting one of the set as the tentative error based on the tentative decision;
(c) generating a set of noise-prediction filter tap coefficients for a filter from the tentative error;
(d) applying the tentative error to the filter to generate an error estimate;
(e) adjusting the quantized signal based on the error estimate;
(f) estimating a data value for the adjusted, quantized signal; and
(g) generating a tentative decision for the received signal.

2. The invention of claim 1, wherein:
the step of quantizing the received signal comprises the steps of (a1) generating a sampling clock to sample the received signal, (a2) generating, with a phase detector, a correction for the phase of the sampling clock with transition data and detected data, and (a3) adjusting the phase of the sampling clock based on the correction, and
the step of generating the correction further comprises the step of applying decision feedback equalization to the transition data and the detected data to generate the correction.

3. The invention of claim 1, wherein:
step (b) includes the step of generating a tentative decision $\hat{a}_t(n)$;
for step (b), the tentative error e(n) is generated as:

$$e(n) = y_q(n) - \hat{a}_t(n) y_t$$

from the quantized signal $y_q(n)$ and desired target level $y_t$; and,
for step (d), the error estimate is generated as:

$$\hat{e}(n) = \Sigma_{k=1}^{N_p} e(n-k) p_k,$$

from noise-prediction filter taps p(k), $1 \leq k \leq N_p$, with $N_p$ the number of noise-prediction filter taps of the filter.

4. The invention of claim 1, wherein step (c) generates the noise-prediction filter taps according to a least mean square (LMS) algorithm.

5. The invention of claim 4, wherein step (c) generates the noise-prediction filter taps with residual error, $e_r(n)$:

$$e_r(n) = e(n) - \hat{e}(n)$$

and noise-prediction filter taps $p_k(n+1)$ as:

$$p_k(n+1) = p_k(n) - 2\mu e_r(n) e(n-k).$$

6. The invention of claim 1, further comprising the step of demodulating the data value.

7. The invention of claim 1, wherein step (c) generates the set of noise-prediction taps off-line in accordance with a solution for a set of Yule-Walker equations based on autocorrelation statistics.

8. The invention of claim 1, further comprising the step of adjusting a sampling clock based on at least one of (i) the adjusted and quantized signal, (ii) the tentative error, (iii) the filtered error, and (iv) the estimated data value.

9. The invention of claim 1, further comprising the step of generating tap coefficients for a receiver equalizer based on at least one of (i) the adjusted and quantized signal, (ii) the tentative error, (iii) the tentative decision, (iv) the filtered error, and (v) the estimated data value.

10. The invention of claim 1, further comprising the step of adjusting coefficients for at least one of a transmit filter through a back channel and an automatic gain control circuit based on at least one of the (i) the adjusted and quantized signal, (ii) the tentative error, (iii) the tentative decision, (iv) the filtered error, and (v) the estimated data value.

11. A circuit for data detection in a serializer-deserializer (SERDES) system comprising:
a quantizer configured to quantize a received signal to one of a plurality of levels;
a tentative error generator configured to generate a tentative error and a tentative decision for the quantized signal;
a filter-tap generator configured to generate a set of noise-prediction filter tap coefficients for a filter from the tentative error;
a filter configured to filter the tentative error to generate a filtered error;
a combiner configured to adjust the quantized signal based on the filtered error;
a data detector configured to estimate a data value for the adjusted, quantized signal; and
logic configured to generate a tentative decision for the received signal, wherein:
  the quantizer quantizes the received signal for each one of a plurality of levels based on an error bound for each level, and
  the tentative error generator generates a set of tentative errors for the plurality of levels based on the quantized signal for each one of the plurality of levels, and selects one of the set as the tentative error based on the tentative decision.

12. The invention of claim 11, wherein:
the quantizer comprises:
  a sampler configured to generates samples from the received signal based on a sampling clock;
  a clock/data recovery (CDR) circuit configured to generate the sampling clock; and
  a phase detector adapted to generate a phase correction between a phase of the sampling clock and a phase of the received signal, wherein (i) the phase detector generates the phase correction based on transition data and detected data, and (ii) the CDR circuit adjusts the phase of the sampling clock based on the correction, and
the invention further comprises decision feedback equalizer (DFE) logic, wherein the DFE logic is configured to apply decision feedback equalization to the transition data and the detected data to generate the correction.

13. The invention of claim 11, wherein:
the tentative error generator is configured to generate the tentative error e(n) based on a tentative decision $\hat{a}_t(n)$ as:

$$e(n) = y_q(n) - \hat{a}_t(n) y_t$$

from the quantized signal $y_q(n)$ and desired target level $y_t$; and,
the error estimate is given by:

$$\hat{e}(n) = \Sigma_{k=1}^{N_p} e(n-k) p_k,$$

from noise-prediction filter taps $p_k$, $1 \leq k \leq N_p$, with $N_p$ the number of noise-prediction filter taps of the filter.

14. The invention of claim 11, wherein filter-tap generator generates the noise-prediction filter taps according to a least mean square (LMS) algorithm.

15. The invention of claim 14, wherein filter-tap generator generates the noise-prediction filter taps with residual error, $e_r(n)$:

$$e_r(n)=e(n)-\hat{e}(n)$$

and noise-prediction filter taps $p_k(n+1)$ as:

$$p_k(n+1)=p_k(n)-2\mu e_r(n)e(n-k).$$

16. The invention of claim 11, further comprising a demodulator configured to demodulate the data value.

17. The invention of claim 11, wherein the filter-tap generator generates the set of noise-prediction taps off-line in accordance with a solution for a set of Yule-Walker equations based on auto-correlation statistics.

18. The invention of claim 11, further comprising a clock/data recovery circuit configured to adjust a sampling clock based on at least one of (i) the adjusted and quantized signal, (ii) the tentative error, (iii) the filtered error, and (iv) the estimated data value.

19. The invention of claim 11, further comprising a clock/data recovery circuit configured to adjust tap coefficients of a receive equalizer based on at least one of (i) the adjusted and quantized signal, (ii) the tentative error, (iii) the tentative decision, (iv) the filtered error, and (v) the estimated data value.

20. The invention of claim 11, further comprising a clock/data recovery circuit configured to adjust coefficients of a transmit equalizer based on at least one of (i) the adjusted and quantized signal, (ii) the tentative error, (iii) the tentative decision, (iv) the filtered error, and (v) the estimated data value.

21. A method of data detection in a serializer-deserializer (SERDES) system comprising the steps of:
   (a) quantizing a received signal to one of a plurality of levels;
   (b) generating a tentative error and a tentative decision for the quantized signal;
   (c) generating a set of noise-prediction filter tap coefficients for a filter from the tentative error;
   (d) applying the tentative error to the filter to generate an error estimate;
   (e) adjusting the quantized signal based on the error estimate; and
   (f) estimating a data value for the adjusted, quantized signal, wherein:
   the step of quantizing the received signal comprises the steps of (a1) generating a sampling clock to sample the received signal, (a2) generating, with a phase detector, a correction for the phase of the sampling clock with transition data and detected data, and (a3) adjusting the phase of the sampling clock based on the correction, and
   the step of generating the correction further comprises the step of applying decision feedback equalization to the transition data and the detected data to generate the correction.

22. A method of data detection in a serializer-deserializer (SERDES) system comprising the steps of:
   (a) quantizing a received signal to one of a plurality of levels;
   (b) generating a tentative error and a tentative decision for the quantized signal;
   (c) generating a set of noise-prediction filter tap coefficients for a filter from the tentative error;
   (d) applying the tentative error to the filter to generate an error estimate;
   (e) adjusting the quantized signal based on the error estimate;
   (f) estimating a data value for the adjusted, quantized signal; and
   (g) adjusting a sampling clock based on at least one of (i) the adjusted and quantized signal, (ii) the tentative error, (iii) the filtered error, and (iv) the estimated data value.

* * * * *